United States Patent [19]

Marget et al.

[11] Patent Number: 4,712,153
[45] Date of Patent: Dec. 8, 1987

[54] POWER CIRCUIT AND TRIGGER DEVICE COMPRISING SAME

[75] Inventors: Christian Marget, Verneuil-en-Halatte; Gérard Rose, Villers St Paul, both of France

[73] Assignee: Charbonnages de France, Paris, France

[21] Appl. No.: 771,680

[22] Filed: Sep. 3, 1985

[30] Foreign Application Priority Data

Sep. 3, 1984 [FR] France ................................ 84 13571

[51] Int. Cl.$^4$ .............................................. H02H 3/20
[52] U.S. Cl. ........................................ 361/91; 361/56; 330/207 P
[58] Field of Search .................... 361/56, 86, 91, 110, 361/111; 330/298, 207 P

[56] References Cited

U.S. PATENT DOCUMENTS

| | | | |
|---|---|---|---|
| 4,217,618 | 8/1980 | Kellenbenz et al. | 361/56 |
| 4,424,544 | 1/1984 | Chang et al. | 361/56 |
| 4,455,585 | 6/1984 | Murari et al. | 361/56 X |
| 4,543,539 | 9/1985 | Seki et al. | 330/207 P X |

FOREIGN PATENT DOCUMENTS

| | | |
|---|---|---|
| 0048758 | 7/1981 | European Pat. Off. . |
| 1279329 | 12/1961 | France . |
| 1540797 | 9/1968 | France . |

Primary Examiner—Philip H. Leung
Assistant Examiner—Derek S. Jennings
Attorney, Agent, or Firm—Browdy and Neimark

[57] ABSTRACT

A power circuit comprises a current amplifier circuit connected between a minimum potential line and a maximum potential line. It further comprises, connected between these lines together with the aforementioned main circuit, a protection circuit which has a control input. A trigger and distributor circuit is connected in parallel with these circuits and is adapted to neutralize the protection circuit, via its control input, when the voltage across the main circuit is below a threshold value. Is it also adapted to activate the protection circuit when the voltage across the main circuit reaches this threshold value, while maintaining the voltage across the main circuit at an approximately constant ratio to the voltage between the two potential lines. The circuit is applicable in particular to controling failsafe alarm circuits, by means of logic signals, for example.

20 Claims, 2 Drawing Figures

POWER CIRCUIT AND TRIGGER DEVICE COMPRISING SAME

BACKGROUND OF THE INVENTION

1. Field of the invention

The present invention concerns a current amplifier power circuit and the application of this circuit in a selective triggering device (solid-state relay), specifically adapted to control the triggering of an alarm.

2. Description of the prior art

There are already known transistor amplifier power circuits which comprise a plurality of bipolar transistors connected by their collectors and their emitters between a maximum potential line and a minimum potential line and connected in cascade, but these circuits entail the use of a considerable number of transistors when there is a requirement to withstand a potential difference significantly greater than the maximum potential difference tolerable by each of the transistors between its collector and its emitter, substantially double this maximum tolerable difference, for example.

One object of the invention is a current amplifier power circuit which can withstand, with a limited number of components, an overall voltage significantly higher than the maximum voltage tolerable by the components in isolation.

Another object of the invention is a selective triggering device or solid-state relay equipped with a power circuit of the aforementioned type which is adapted to supply power only in the presence of an input signal and so procures failsafe control of the load circuit to be triggered. The latter is sometimes itself of the failsafe type; in the case of an alarm circuit, an alarm device is triggered when said alarm circuit ceases to be energized through the power circuit.

The invention is also directed to a triggering device of the aforementioned type adapted to be controlled by logic signals.

The invention also applies to a device of the aforementioned type adapted to provide galvanic isolation between the input logic signals and the power circuit.

The invention is also directed to be a switchable triggering device adapted to react to input logic signals according to various predetermined operating modes.

SUMMARY OF THE INVENTION

The invention consists in a power circuit comprising a current amplifier circuit connected between a minimum potential line and a maximum potential line, a protection circuit connected between said minimum potential line and said maximum potential line and in series with said current amplifier circuit, hereinafter referred to as the main circuit, said protection circuit having a control terminal, and a trigger and distributor circuit connected in parallel with said main circuit and said protection circuit adapted to neutralize said protection circuit via its control terminal when the voltage across said main circuit is below a threshold value and to activate said protection circuit when said voltage across said main circuit reaches said threshold value whilst maintaining said voltage across said main circuit at a substantially constant ratio to the voltage between said minimum and maximum potential lines. A circuit of this kind makes it possible to obtain a a high overall voltage because the voltages across the main circuit and the protection circuit are added together, but safeguards these circuits because the voltage across the main circuit is kept below a critical threshold.

According to advantageous features of the invention, the main circuit is a bipolar transistor connected between the potential lines by its emitter and its collector, the protection circuit for the main circuit is a field effect transistor of which the gate (or grid) constitutes said control terminal, and the trigger and distributor circuit comprises a voltage detector, such as a zener diode, connected in parallel with the main amplifier circuit and between the control electrode of the protection circuit and a point common to the latter and the main circuit. The component is advantageously included in a resistive circuit adapted to maintain the voltage across these circuits in a ratio close to that of the maximum voltages tolerable by the circuits when the protection circuit is not neutralized; in this way the invention makes it possible to achieve in reliable manner an overall voltage which is only slightly less than the sum of the maximum voltages associated with their circuits.

It should be noted that the invention enables a current to flow at high voltage whilst benefitting from the high current gain for low signals offered by transistors with a relatively low maximum voltage, which would not be permitted by a transistor with a high maximum voltage.

In accordance with other advantageous features of the invention, a power circuit of the aforementioned type is integrated into a trigger device, controlled by binary signals, for example, which incorporates between its input terminals and the power circuit a galvanic isolation circuit, advantageously of the optocoupler type; the triggering circuit advantageously procures an even number of inversions of the signal so as to permit a current to flow through the power circuit only in the presence of a signal in the isolation circuit. When the intention is to control the triggering of an external load circuit comprising an alternating current voltage source, the invention provides that the aforementioned triggering device comprises two power circuits connected in parallel with opposite polarities so as to each generate, where necessary, a rectifier current respectively corresponding to the positive or negative half-waves associated with said source. A switch is advantageously incorporated between the inputs associated with each of the power circuits so as to disconnect one of the circuits, or to apply the control logic signals to the circuits or to apply complementary control logic signals to the circuits.

Further objects, characteristics and advantages will emerge from the following description given by way of a non-limiting example with reference to the accompanying drawings.

DESCRIPTION OF THE PREFERRED EMBODIMENTS

Figure 1:
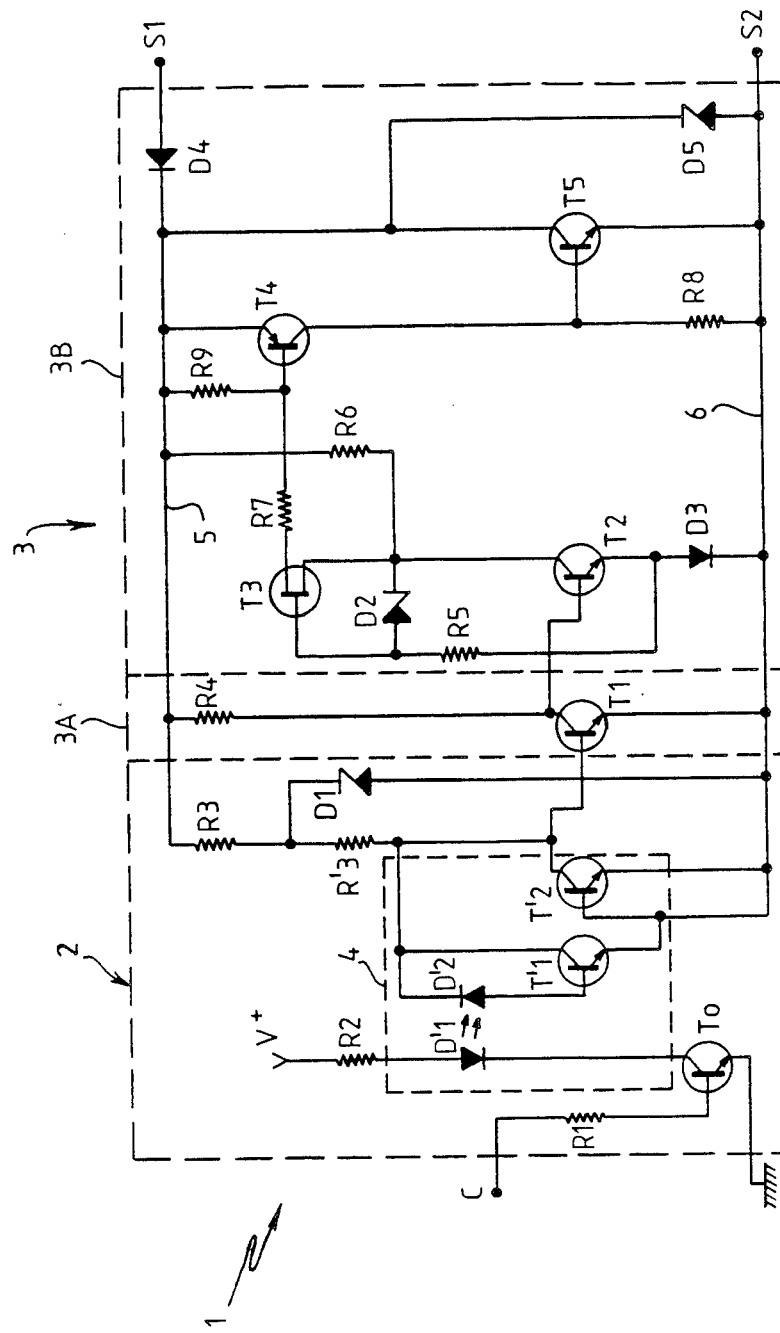
FIG. 1 is an electrical circuit schematic of a trigger device comprising a power circuit in accordance with the invetnion.

FIG. 1 shows by way of an example of the application of the invention, a trigger device 1 having an input terminal C, another input terminal connected to ground and two output terminals S1 and S2.

The device 1 principally comprises an input circuit 2 and a power circuit 3 which in turn comprises an inverter stage 3A and a power amplifier stage 3B.

The input circuit 2 comprises a coupling circuit 4 adapted to provide galvanic isolation between its input and output terminals and a switching circuit adapted to apply an on/off signal to the input of this coupling circuit. This switching circuit principally comprises a power supply V+ and a bipolar junction transistors T0, in this instance of NPN type, the base of which is connected by a resistor R1 to the terminal C, the emitter of which is connected to ground and the collector of which is connected to an input terminal of the optocoupler 4, the other input terminal being connected to the power supply V+ by a resistor R2.

The coupler 4 principally comprises a light-emitting diode D'1 and a photodiode D'2; D'1 is connected directly between the supply V+ and the transistor T0, whereas D'2 is connected in the reverse direction between the collector and the base of an NPN bipolar transistor T'1 the emitter of which is connected to the base of a similar bipolar transistor T'2. T'1 and D'2 conjointly operate as a phototransistor.

The optocoupler 4 is connected within the input circuit 2 in such a way that the collectors and the emitters of the transistors T'1 and T'2 are connected to one another: the collectors are connected by a resistive circuit R3 - R'3 to a maximum potential line 5 whereas the emitters are connected to a minimum potential line 6. A zener diode D1 operating as a voltage limiter is connected between the point common to resistors R3 and R'3 and the minimum potential line 6.

The inverter stage 3A in the input of the power circuit 3 comprises an inverter circuit T1 connected between the potential lines 5 and 6, having a control electrode connected to the collectors of the transistors T'1 and T'2. As shown, this circuit consists of an NPN type transistor T1 with the input taken to its base, its collector connected to the maximum potential line 5 through a resistor R4 and its emitter connected to the minimum potential line. The collector of T1 constitutes an input terminal of the amplifier stage 3B.

This stage comprises a main amplifier circuit, a protection circuit and a resistive circuit connected in series between the potential lines 5 and 6 and a network of components connected in parallel to these circuits by virtue of being connected to their common point. The main circuit is connected to the inverting circuit T1 and to the minimum potential line 6; as shown, this first circuit comprises a single NPN transistor T2 the base of which is connected to the collector of T1 and the emitter of which is connected to the line 6 by a diode D3 connected in the forward direction so as to be at a potential 0.6 V higher than that of this line. The other, so-called protection circuit connected between the maximum potential line 5 and the maximum voltage point in the first circuit, in this instance the collector of T2, is controlled by the network of components connected in parallel according to the voltage across the main circuit; the control terminal of this second circuit is connected to its minimum potential terminal by a voltage detector device also connected in series with a resistive device across the first circuit. As shown, this second circuit comprises an N-channel field effect transistor T3 the grid of which is the control terminal of said second circuit; the drain of this transistor is connected to the maximum potential line 5 by two resistors R7 and R9. The network of components connected in parallel with these circuits comprises, in the direction from the line 5 to the line 6, a resistor R6 connected to the point common to the two amplifier circuits T2 and T3, a zener diode D2 forming a voltage detector connected between this common point and the grid of T3 in series with a resistor R5, between this common point and the emitter of T2, and then a diode D3.

These series-connected circuits control a current amplifier circuit here consisting of two transistors T4 and T5, of PNP and NPN types, respectively, connected in cascade. The base of T4 is connected to the point common to resistors R7 and R9, its emitter is connected to the line 5 and its collector is connected to the line 6 through a resistor R8; the base of T5 is connected to the collector of T4 and its collector and its emitter are connected directly to lines 5 and 6, respectively. A zener diode D5 operating as a voltage limiter is connected between the collector and the emitter of T5. A diode D4 is connected between S1 and the maximum potential line 5 so as to prevent any flow of current to S1 from this line 5.

By way of example: the optocoupler 4 is of type 6N139 (high input sensitivity); the zener diodes D1 and D2 are limited to 5.1 V; the diode D4 is of type 1N4007; the diode D5 is limited to 80 V; transistors T1 and T2 are type 2N930 (limit voltage 45 V), T3 is type 2N4338 (limit voltage 50 V and cut-off voltage guaranteed below 1 V), T4 and T5 are types 2N4920 and 2N4923, respectively. The resistors R3, R'3 and R6 have the value 1 Megohm; R4 2 Megohms; R5 820 kohms; R7 100 ohms; R8 10 kohms; and R9 100 kohms. It may be verified that the circuit of FIG. 1, using components having the aforementioned characteristics, may be used to control a high power level (70 V - 300 mA) with a control current of approximately 100 µA, that is a power of less than 1 mW. Note that the power circuit in accordance with the invention makes it possible to control a voltage significantly higher than the maximum voltages tolerable by the optocoupler 4, T1 and especially transistors T2 and T3.

The triggering device or solid-state relay of FIG. 1 is adapted to respond to control logic signals applied at C corresponding to a potential difference that is either positive or null between C and ground.

When C is at a potential sufficiently above the ground potential, T0 conducts and the light-emitting diode D'1 emits photons towards D'2; because of the way D'2 is connected, T'1 conducts. The function of the diode D1 is to limit the current in R'3 so as to enable T'1 to control T1. The supply voltage of the source V+ is selected so that the current passing through D'1 induces across T1 a saturation voltage which is sufficiently low to cut off T1 (below 0.2 V, for example). T2 then conducts; its saturation voltage, which is applied via D2 to the grid of T3, is insufficient to cut off the latter which thus has a low resistance, very much lower than the resistance of R9. The major part of the control current is amplified by T4 and T5 and a low voltage drop, and thus a low residual voltage, is established between S1 and S2.

On the other hand, when the transistor T0 is cut off (voltage at C equal to the ground voltage), the photodiode D'2 does not receive any photons and does not output any current: T'1 is cut off; the base-emitter junction of T1 maintains the collector-emitter voltage of T'1 at 0.6 V whatever the voltage commanded. T1 conducts and T2 cuts off. The voltage across T2 rises rapidly, as does the voltage across D2. When this latter voltage, in rising towards its threshold (5.1 V), exceeds the cut-off voltage of T3, then T3 is cut off and the voltage across it increases, being added to the voltage across T2. The zener diode D5 limits the total voltage between lines 5 and 6 to 80 V. The network of components R5-R6-D2-D3 tends to maintain the potential at the collector of T2 at approximately half this total voltage, by virtue of which the voltages across the transistors T2 and T3 remain below their maximum tolerable voltages, which are of the same order of magnitude in the example under discussion. It is therefore confirmed that the power circuit in accordance with the invention makes it possible to obtain without risk a voltage very much higher than the maximum voltage tolerable by each of transistors T2 and T3. Note that the voltage across D2 varies with the voltage across T2; the firing of T3, which takes place when the voltage across D2 exceeds the cut-off threshold of T3, therefore intervenes for a voltage theshold across T2.

Note that T1 in face implements an inverter function. Its presence is necessary to obtain failsafe control of any external circuit connected to the output of the power circuit; in the presence of a control current, the solid-state relay 1 enables an external current flow. T1 compensates a first inversion introduced by the choice of circuit employed; it is subjected to a maximum voltage which remains low (1.1 V) thanks to T2 and D3.

T2, T4 and T5, connected in cascade via T3, amplify the control current.

T3 operates as a variable resistor and prevents the voltage acorss T2 becoming too high if T2 is cut off. The network of components R6-D2-R5-D3 constitutes a safeguard circuit for T2 by virtue of the controling of T3 by D2 which causes T3 to take a part of the supply voltage when the voltage across T2 becomes too high; this network constitutes a triggering circuit for T3 and a circuit for distributing voltage between T2 and T3.

The diode D5 eliminates voltage surges which could occur on cutting off with an inductive load (relay). D4 protects the circuit against negative voltages.

Note that T'2, part of a type 6N139 optocoupler, is not used, so that only a low control voltage is obtained at the base of T1 when T'1 is saturated; T'2 may be dispensed with.

Figure 2:
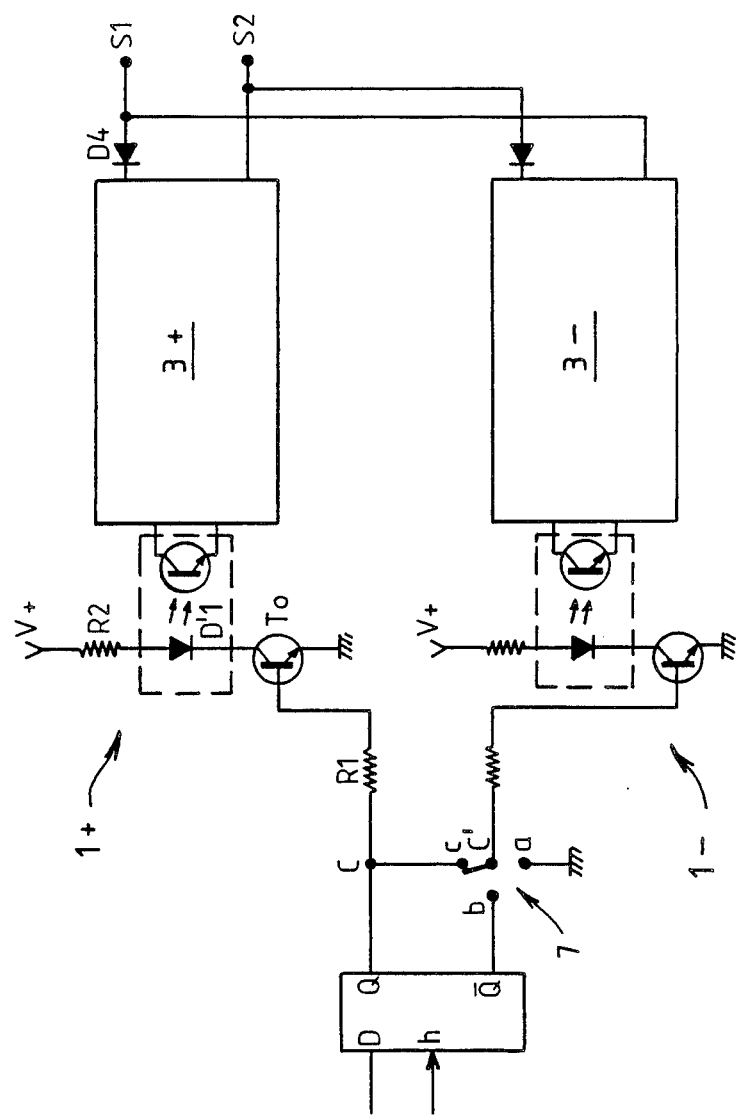
FIG. 2 is a block schematic of another trigger device comprising two power circuits in accordance with the invention.

FIG. 2 shows a trigger device analogous to that of FIG. 1 but in a more sophisticated version, adapted to control a load circuit causing alternating current signals to appear between S1 and S2, the combination D'2-T1 being schematically represented by a phototransistor.

This improved device actually comprises two elementary devices 1+ and 1− analogous to that of FIG. 1, adapted to pass (or to block) positive half-cycles and negative half-cycles, respectively. These elementary devices differ primarily in terms of the way they are connected to the output terminals S1 and S2, as emerges on examining in FIG. 2 the connection of the rectangles 3+ and 3− (representing the power circuits of the trigger devices 1+ and 1−) to the terminals S1 and S2; the diodes D4 which formed part of the power circuit 3 in FIG. 1 have been shown externally to the circuits 3+ and 3− to emphasize this aspect.

The trigger devices 1+ and 1− have respective input terminals C and C' and input terminals connected to ground.

In the example of FIG. 2, the elementary devices 1+ and 1− are connected to the output of a logic circuit having two complementary outputs Q and $\overline{Q}$. A switch 7 advantageously makes it possible to modify the connection of one of the elemenatary devices, in this instance the device 1−. This switch has three positions. In a first positions a, C' is connected to ground, which amounts to neutralizing the device 1−. In a second position b, the devices 1+ and 1− are controlled by complementary logic signals and only one of the devices operates at a time. In a third position c, the devices 1+ and 1− are controlled by the same logic signal and carry out synchronized operating cycles.

It will be understood that various changes in the details, materials and arrangements of parts which have been herein described and illustrated in order to explain the nature of the invention may be made by those skilled in the art within the principle and scope of the invention as expressed in the appended claims. For example, the structure of the main circuit and the protection circuit which, in FIG. 1, each comprise only one transistor, may be made more complex; when the maximum voltage tolerable by the circuits are not the same, it is necessary to modify appropriately the components of the associated safeguard circuit so as to maintain the potential at the point common to these circuits in a ratio to the overall voltage approximating the ratio of said maximum tolerable voltages. A different ratio is possible although a priori disadvantageous.

The number, distribution and characteristics of the various components (resistors, diodes, etc) are naturally to be determined according to requirements.

There is claimed:

1. Power circuit comprising a main circuit having a current amplifier circuit connected between a minimum potential line and a maximum potential line, a protection circuit connected between said minimum potential line and said maximum potential line and in series with said current amplifier circuit, said protection circuit having a control terminal, and a trigger and distributor circuit connected in parallel with said main circuit and said protection circuit adapted to neutralize said protection circuit via its control terminal when the voltage across said main circuit is below a threshold value and to activate said protection circuit when said voltage across said main circuit reaches said threshold value whilst maintaining said voltage across said main circuit at a substantially constant ratio to the voltage between said minimum and maximum potential lines.

2. Circuit according to claim 1, wherein said main circuit comprises a bipolar transistor the base of which constitutes its control electrode.

3. Circuit according to claim 1, wherein said protection circuit comprises a field effect transistor the grid of which constitutes said control terminal.

4. Circuit according to claim 1, wherein said trigger and distributor circuit comprises a voltage detector connected between a point common to said protection circuit and said main circuit and said control terminal of said protection circuit and a resistive component connected in series with said voltage detector between said common point and the terminal of said main circuit which is connected to said minimum poential line.

5. Circuit according to claim 4, wherein said voltage detector is a zener diode.

6. Circuit according to claim 1, wherein said voltage across said main circuit is maintained at a predetermined ratio to said voltage between said minimum and maximum potential lines when said protection circuit is activated.

7. Circuit according to claim 6, wherein said ratio is substantially equal to the ratio of the maximum voltage that can be tolerated by said main circuit and the sum of said maximum voltage and the maximum voltage that can be tolerated by said protection circuit.

8. Trigger device incorporating a power circuit comprising a main circuit having a current amplifier circuit connected between a minimum potential line and a maximum potential line, a protection circuit connected between said minimum potential line and said maximum potential line and in series with said current amplifier circuit, said protection circuit having a control terminal, and a trigger and distributor circuit connected in parallel with said main circuit and said protection circuit adapted to neutralize said protection circuit via its control terminal when the voltage across said main circuit is below a threshold value and to activate said protection circuit when said voltage across said main circuit reaches said threshold value whilst maintaining said voltage across said main circuit at a substantially constant ratio to the voltage between said minimum and maximum potential lines, said trigger device further comprising a galvanic isolation circuit.

9. Device according to claim 8, wherein said galvanic isolation circuit comprises an optocoupler.

10. Device according to claim 8, wherein, in order to achieve failsafe operation, said galvanic isolation circuit and said power circuit are connected in such a way that said power circuit is conducting when a control current flows in said galvanic isolation circuit.

11. Device according to claim 8, comprising two similar power circuits the outputs of which are coupled with opposite polarities.

12. Device according to claim 11, adapted to be controlled by a logic circuit having two complementary outputs, wherein the input of one of said power circuits is adapted to be connected to one output of said logic circuit and further comprising a three-position switch to which the input of the other of said power circuits is connected and which is adapted to connect to said other power circuit input a continuous null signal or the signal applied to said first power circuit or the complement of the signal applied to said first power circuit.

13. Power circuit comprising:
a minimum potential line and a maximum potential line,
a current amplifier circuit and a protection circuit connected in series between said minimum potential line and said maximum potential line, said protection circuit having a control terminal and adapted to be neutralized or activated depending on whether a neuralization or activation signal is supplied to said control terminal,
a trigger and distributor circuit connected in parallel with said current amplifier circuit and said protection circuit including voltage sensing means connected in parallel with said current amplifier circuit for sensing voltage across said current amplifier circuit and comparison and control means for comparing said sensed voltage to a predetermined threshold value and supplying to said control terminal a neutralization signal when said sensed voltage is less than said threshold value and an activation circuit when said sensed voltage is more than said threshold value, and voltage distributor means for maintaining sid sensed voltage across said current amplifier at a substantially constant ratio to the voltage said minimum and maximum potential lines.

14. Power circuit according to claim 13, wherein said current amplifier comprises a bipolar transistor, the base of which constitute a control electrode.

15. Power circuit according to claim 13, wherein said protection circuit comprises a field effect transistor, the grid of which constitutes said control terminal.

16. Power circuit according to claim 15, wherein said voltage sensing means comprises a zener diode and a resistive component connected in series.

17. Power circuit according to claim 16, wherein said comparison and control means comprises said field effect transistor, said zener diode being further connected between a point common to said current amplifier circuit and to said protection circuit and said control terminal.

18. Power circuit according to claim 17, wherein said voltage distributor means comprises a chain of resistive components connected between said maximum potential line and said minimum potential line, partly in parallel with said protection circuit and partly in parallel with said current amplifier circuit.

19. Trigger device comprising two power circuits each comprising:
a minimum potential line and a maximum potential line,
a current amplifier circuit and a protection circuit connected in series between said minimum potential line and said maximum potential line, said protection circuit having a control terminal and adapted to be neutralized or activated depending on whether a neutralization or activation signal is supplied to said control terminal,
a trigger and distributor circuit connected in parallel with said current amplifier circuit and said protection circuit including voltage sensing means connected in parallel with said current amplifier circuit for sensing voltage across said current amplifier circuit and comparison and control means for comparing said sensed voltage to a predetermined threshold value and supplying to said control terminal a neutralization signal when said sensed voltage is less than said threshold value and an activation circuit when said sensed voltage is more than said threshold value, and voltage distributor means for maintaining said sensed voltage across said current amplifier at a substantially constant ratio to the voltage between said minimum and maximum potential lines, these power circuits being connected so that said respective minimum and maximum potential lines of one of said power circuits are connected to said respective maximum and minimum potential lines.

20. Trigger device according to claim 19, adapted to be controlled by a logic circuit having two complementary outputs, wherein the input of one of said power circuits is adapted to be connected to one output of said logic circuit and further comprising a three-position switch to which the input of the other of said power circuits is connected to and which is adapted to connect to said other power circuit input a continuous null signal or the signal applied to said first power circuit or the complement of the signal applied to said first power circuit.

* * * * *